(12) United States Patent
M Barghi et al.

(10) Patent No.: US 12,051,623 B2
(45) Date of Patent: Jul. 30, 2024

(54) ENHANCED GRATING ALIGNED PATTERNING FOR EUV DIRECT PRINT PROCESSES

(71) Applicant: Intel Corporation, Santa Clara, CA (US)

(72) Inventors: Seyedhamed M Barghi, North Plains, OR (US); Shyam Benegal Kadali, Portland, OR (US); Marvin Y. Paik, Portland, OR (US); Sheng-Po Fang, Beaverton, OR (US); Leonard P. Guler, Hillsboro, OR (US); Charles H. Wallace, Portland, OR (US); James Y. Jeong, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 731 days.

(21) Appl. No.: 17/107,717

(22) Filed: Nov. 30, 2020

(65) Prior Publication Data

US 2022/0172857 A1    Jun. 2, 2022

(51) Int. Cl.
*H01L 21/768*    (2006.01)
*H01L 21/033*    (2006.01)
*H01L 21/311*    (2006.01)

(52) U.S. Cl.
CPC .... *H01L 21/76897* (2013.01); *H01L 21/0337* (2013.01); *H01L 21/31144* (2013.01); *H01L 21/76816* (2013.01)

(58) Field of Classification Search
CPC ........... H01L 21/0337; H01L 21/31144; H01L 21/76816; H01L 21/76897

(Continued)

(56) References Cited

U.S. PATENT DOCUMENTS

2016/0020303 A1    1/2016 Jun et al.
2018/0114721 A1    4/2018 Mohanty
(Continued)

FOREIGN PATENT DOCUMENTS

KR    10-2010-0072885 A    7/2010

OTHER PUBLICATIONS

International Search Report and Written Opinion for International Patent Application No. PCT/US2021/051379, mailed Jan. 10, 2022, 12 pgs.

(Continued)

*Primary Examiner* — Hoai V Pham
(74) *Attorney, Agent, or Firm* — Schwabe, Williamson & Wyatt, P.C.

(57) ABSTRACT

Embodiments disclosed herein include methods of patterning a back end of line (BEOL) stack and the resulting structures. In an embodiment a method of patterning a BEOL stack comprises forming a grating over an interlayer dielectric (ILD), and forming a spacer over the grating. In an embodiment, the spacer is etch selective to the grating. In an embodiment, the method further comprises disposing a hardmask over the grating and the spacer, and patterning the hardmask to form an opening in the hardmask. In an embodiment, the method further comprises filling the opening with a plug, removing the hardmask, and etching the spacer. In an embodiment, a portion of the spacer is protected from the etch by the plug. In an embodiment, the method may further comprise removing the plug, and transferring the grating into the ILD with an etching process.

20 Claims, 13 Drawing Sheets

(58) Field of Classification Search
USPC .................................................. 438/672, 675
See application file for complete search history.

(56) References Cited

U.S. PATENT DOCUMENTS

| | | |
|---|---|---|
| 2020/0219767 A1 | 7/2020 | Raley |
| 2020/0219883 A1* | 7/2020 | Nam ....................... H01L 28/90 |
| 2020/0286792 A1 | 9/2020 | St. Amour et al. |

OTHER PUBLICATIONS

International Preliminary Report on Patentability for International Patent Application No. PCT/US2021/051379, mailed Jun. 16, 2023, 6 pgs.

* cited by examiner

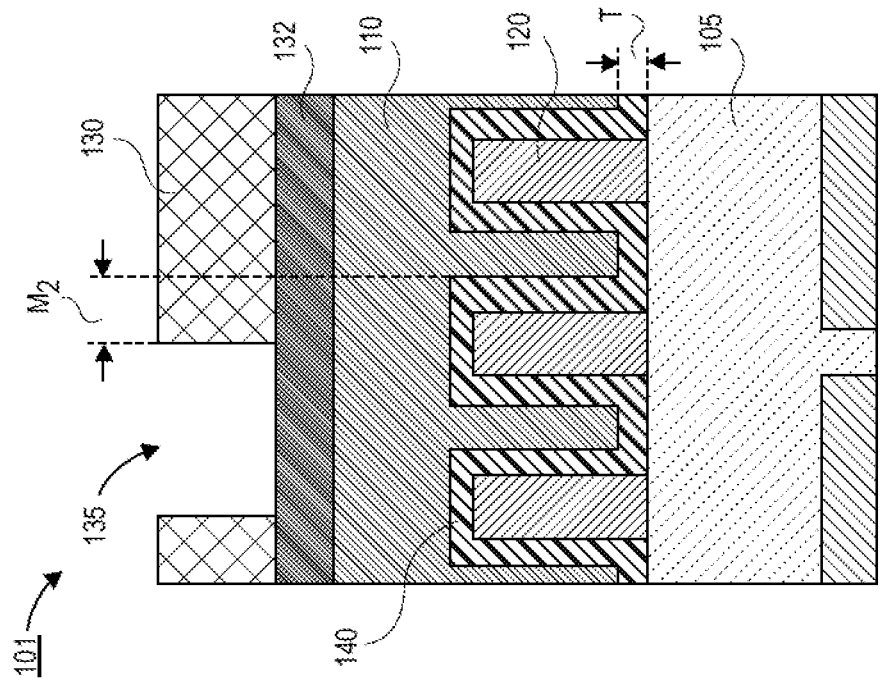
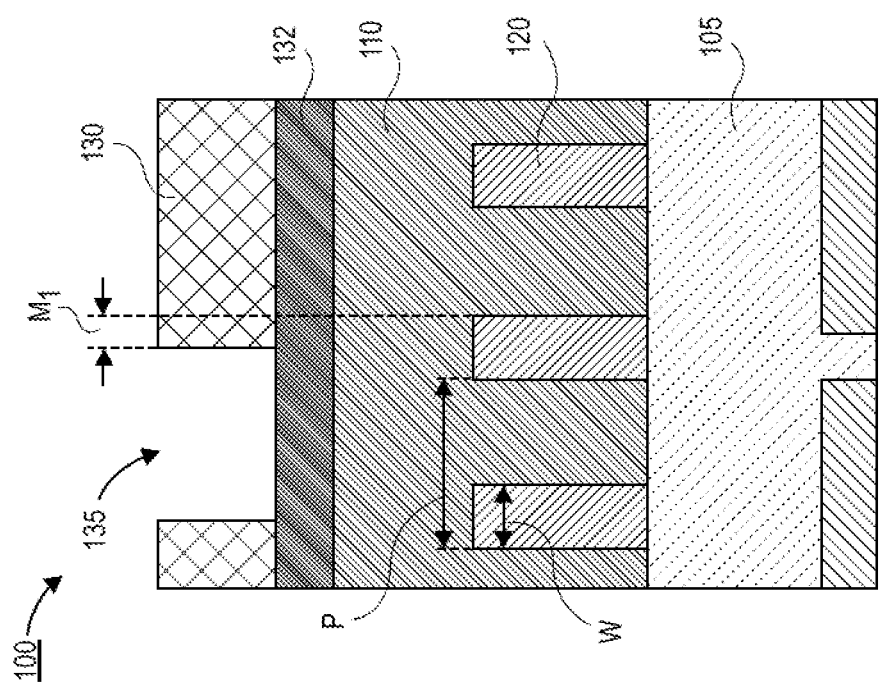

ENHANCED GRATING ALIGNED PATTERNING FOR EUV DIRECT PRINT PROCESSES

TECHNICAL FIELD

Embodiments of the disclosure are in the field of semiconductor structures and processing and, in particular, to methods for improving edge placement error margins while improving manufacturability.

BACKGROUND

In back end of line (BEOL) fabrication, conductive vias and insulative plugs are needed in order to provide the desired electrical routing between layers of the BEOL stack. During the fabrication of the vias and plugs, edge placement errors may generate defects in the device. For example, edge placement errors may result in the creation of unwanted vias that result in undesirable shorts in the BEOL stack. In some BEOL stacks, gratings are used to provide increased overlay margins to avoid edge placement errors. However, as critical dimensions continue to scale, the widths of the gratings decrease. Accordingly, the margins for edge placement error continue to decrease.

BRIEF DESCRIPTION OF THE DRAWINGS

FIG. 1A is a cross-sectional illustration of a semiconductor device that illustrates the small edge placement error margins.

FIG. 1B is a cross-sectional illustration of a semiconductor device that includes a spacer layer that increases the edge placement error margins, in accordance with an embodiment.

DESCRIPTION OF THE EMBODIMENTS

Figure 2A:
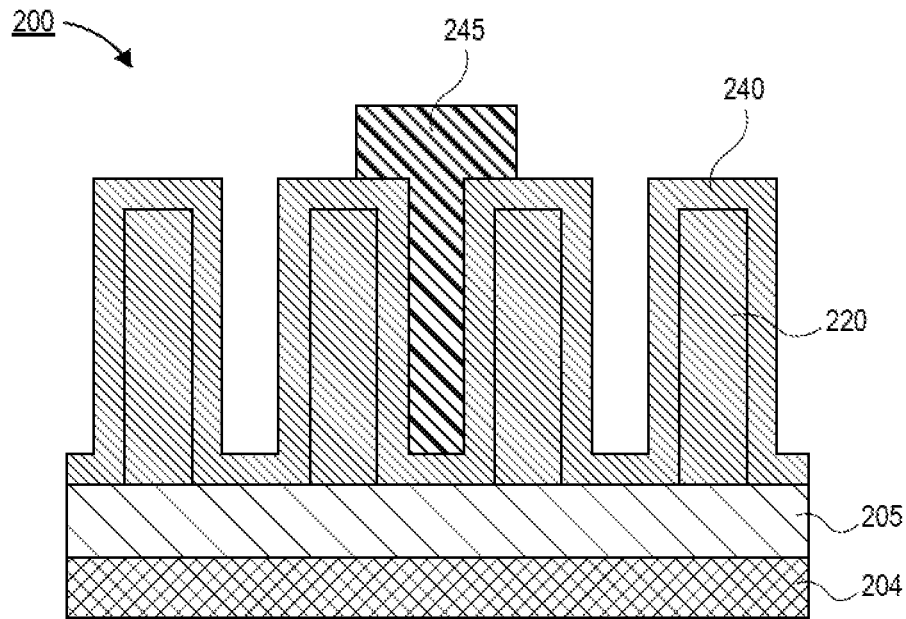
FIG. 2A is a cross-sectional illustration of a semiconductor device with a grating and a spacer, where the grating and the spacer comprise the same material, in accordance with an embodiment.

Embodiments described herein comprise semiconductor devices and methods for improving edge placement error margins while improving manufacturability. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, edge placement error margins are continuing to decrease as semiconductor devices continue to scale to smaller critical dimensions. An example of the available edge placement error margin is shown in FIG. 1A. A semiconductor device 100 is shown in FIG. 1A. The semiconductor device 100 includes a substrate 105 and a grating 120 including a plurality of parallel lines. A hardmask 110 is disposed over the grating 120, and a resist layer 130 and an antireflective coating 132 are disposed over the hardmask 110. As shown, the grating 120 has a pitch P and each of the lines have a width W. For example, the pitch P may be approximately 30 nm and the width W may be approximately 12 nm.

As shown, an opening 135 over a channel between lines of the grating 120 is patterned into the resist layer 130. The opening 135 may have an edge placement error margin $M_1$. In cases where the pitch P is approximately 30 nm and the width W is approximately 12 nm, the edge placement error margin $M_1$ is only approximately 6 nm. That is, all overlay errors in the system can only add up to approximately 6 nm. If the overlay errors exceed 6 nm, there is a chance that the opening 135 will inadvertently extend over a neighboring channel. This will result in defects in the semiconductor device (e.g., undesirable vias or plugs).

Accordingly, embodiments disclosed herein include a spacer that increases the edge placement error margin. The increase in the margin allows for greater protection against printing defects and allows for improved scaling of the semiconductor device to smaller critical dimensions (CDs). An example of a semiconductor device 101 that utilizes such a spacer 140 is shown in FIG. 1B.

Referring now to FIG. 1B, a cross-sectional illustration of a semiconductor device 101 is shown, in accordance with an embodiment. The semiconductor device 101 may be substantially similar to the semiconductor device 100 illustrated in FIG. 1A, with the exception that the grating 120 is lined with a spacer 140. The spacer 140 is a conformal layer that is disposed along sidewall surfaces and top surfaces of the grating 120. The inclusion of the spacer 140, therefore, increases the width of the lines in the grating 120. As such, the edge placement error margin $M_2$ is increased. For example, the edge placement error margin $M_2$ may be increased by an amount substantially equal to a thickness T of the spacer 140. For example, the spacer 140 may have a thickness of approximately 5 nm. In such embodiments, the edge placement error margin $M_2$ may be increased from 6 nm to 11 nm.

Figure 2B:
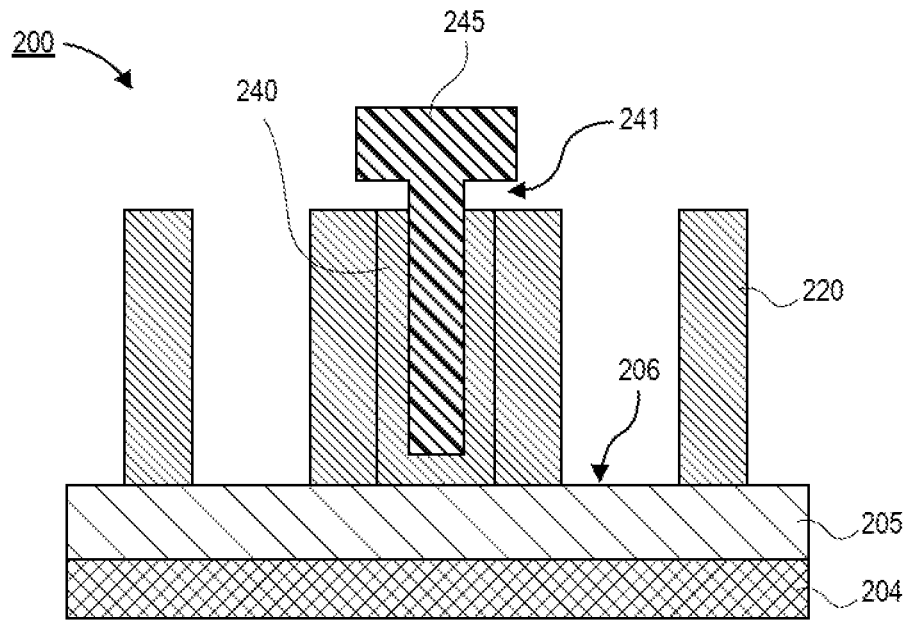
FIG. 2B is a cross-sectional illustration of the semiconductor device in FIG. 2A after an etching process, in accordance with an embodiment.

Referring now to FIGS. 2A and 2B, a pair of cross-sectional illustrations that depicts an etching process of a semiconductor device 200 with a plug over a grating 220 and a spacer 240 is shown. The grating 220 and the spacer 240 are provided over an ILD 205. The ILD 205 may be over a metal layer 204. In some instances, an etchstop layer (not shown) may be provided between the ILD 205 and the metal layer 204.

In the illustrated embodiment, the grating 220 and the spacer 240 comprise substantially the same material or materials and are not etch selective to each other. For example, the grating 220 and the spacer 240 may comprise silicon and nitrogen (e.g., SiN). A plug 245 may be disposed into a channel between parallel lines of the grating 220. The plug 245 protects portions of the spacer 240 during an etching process.

As shown in FIG. 2B, the etching process removes exposed portions of the spacer 240. However, it is to be appreciated that the etching process is not selective to the underlying grating 220, and a timed etch is needed. Due to the low thickness of the spacer 240 (e.g., 5 nm or less), the duration of the etching process is low (e.g., 5 seconds or lower). Such rapid etching processes are not repeatable in most high volume manufacturing (HVM) tools. As such, processing parameters such as, but not limited to, chamber matching, repeatability, etc., are not easily controlled. This may lead to an over etch that damages the grating 220. Additionally, the ILD 205 may not be etch selective to the spacer 240 either. As such, damage to the exposed surfaces 206 may occur as well.

In order to increase the etch duration, a wet etching process may be used instead of a dry etch. However, a wet etching process may result in undercutting the plug 245. That is, portions of the spacer between the plug 245 and the grating 220 may be removed to form an undercut 241. This may result in the plug 245 losing contact with the grating 220, resulting in a missing plug defect.

Accordingly, embodiments disclosed herein include a spacer that is etch selective to the grating. Providing etch selectivity between the spacer and the grating allows for the spacer to be etched without damaging the underlying grating. A biased dry etch may also be used in order to minimize or eliminate undercutting of the plug. The use of etch selective materials allow for a longer duration etching process (e.g., 25 seconds or longer) that is more compatible with HVM processing tools. Additionally, embodiments may include a sacrificial layer between the ILD and the grating. The sacrificial layer may comprise the same material as the spacer to allow etching with a single etching process. The sacrificial layer may also be etch selective to the ILD so that there is minimal damage to the exposed portions of the ILD during the etching process.

Figure 3A:
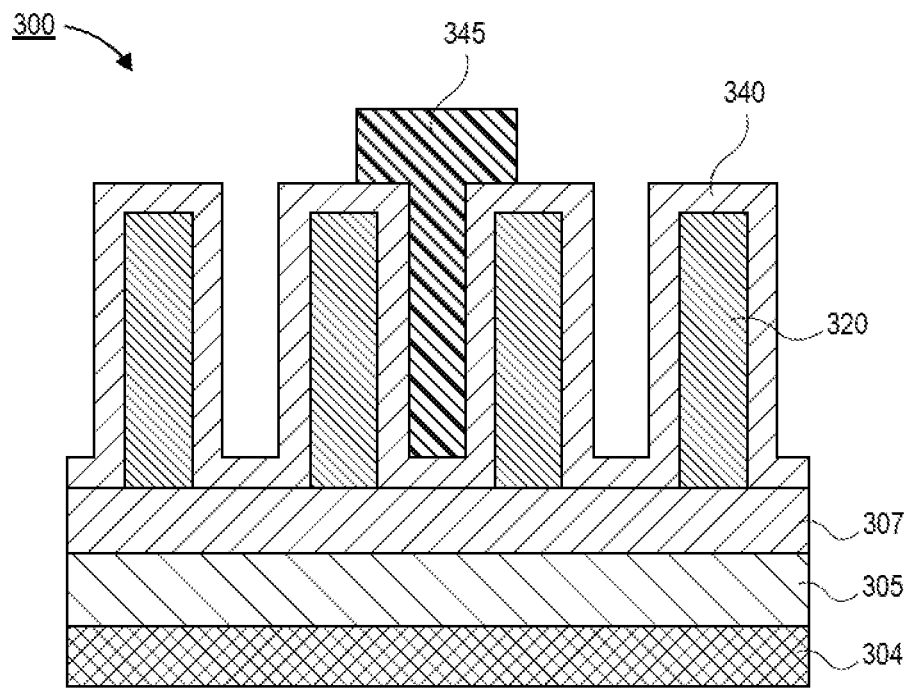
FIG. 3A is a cross-sectional illustration of a semiconductor device with a grating and a spacer, where the grating and the spacer are etch selective with respect to each other, in accordance with an embodiment.
Figure 3B:
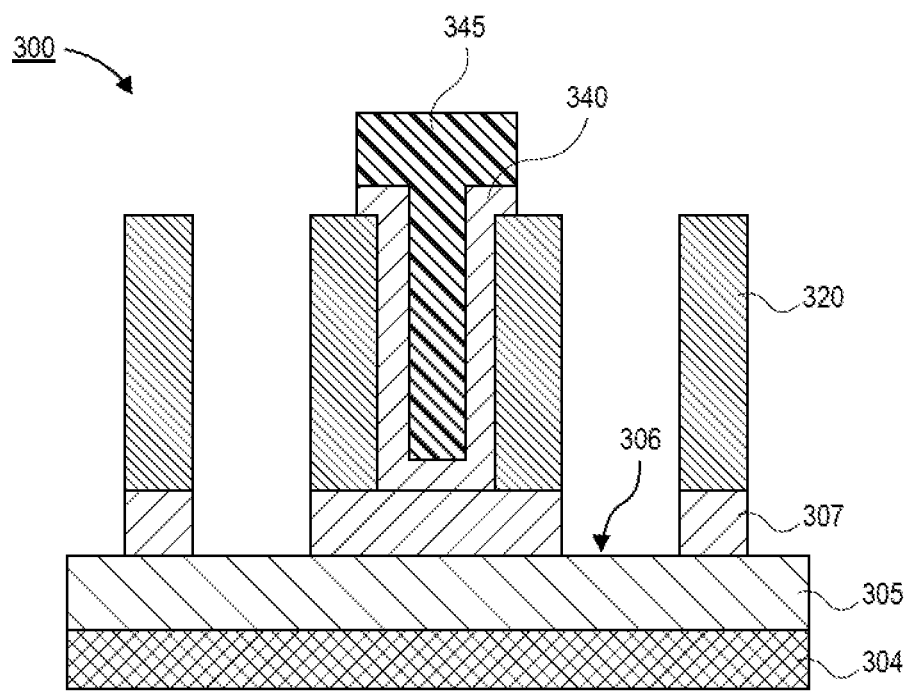
FIG. 3B is a cross-sectional illustration of the semiconductor device in FIG. 3A after an etching process, in accordance with an embodiment.

An example of such an embodiment is shown in FIGS. 3A and 3B. As shown in FIG. 3A, the semiconductor device 300 comprises a sacrificial layer 307 over the ILD 305 and the underlying metal layer 304. The grating 320 and conformal spacer 340 are over the sacrificial layer 307. A plug 345 may be provided between parallel lines of the grating 320.

As shown in FIG. 3B, an etching process removes exposed portions of the spacer 340, and etches through exposed portions of the sacrificial layer 307. Due to the etch selectivity, there is no undercut below the plug 345 and there is substantially no damage to the grating 320. Additionally, there is substantially no damage to the exposed surface 306 of the ILD 305.

Referring now to FIGS. 4A-4H, a series of cross-sectional illustrations depicting a process for forming a plug in a back end of line (BEOL) stack is shown, in accordance with an embodiment.

Figure 4A:
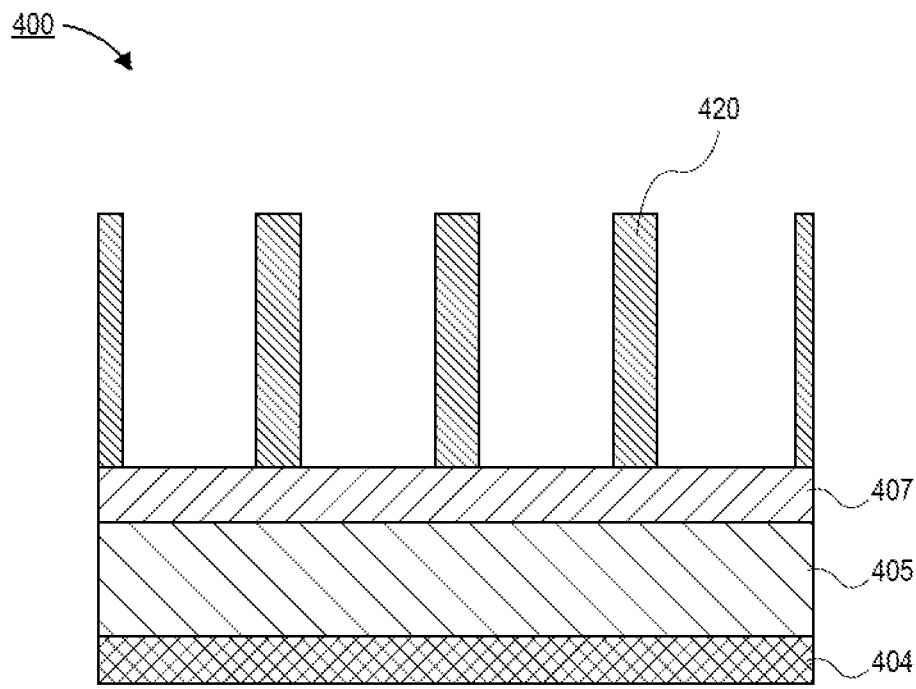
FIG. 4A is a cross-sectional illustration of a semiconductor device with a grating, in accordance with an embodiment.

Referring now to FIG. 4A, a cross-sectional illustration of an electronic device 400 is shown, in accordance with an embodiment. In the illustrated embodiment, only a portion of the BEOL stack is shown. It is to be appreciated that the BEOL stack may be disposed over a semiconductor substrate. In an embodiment, the underlying semiconductor substrate may be a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates.

In the illustrated embodiment, an interconnect layer of the BEOL stack is shown. For example, a metal layer 404 and an ILD 405 over the metal layer 404 are illustrated. In some embodiments, an etchstop layer (not shown) may be provided between the metal layer 404 and the ILD 405. The metal layer 404 may comprise conductive traces used to provide interconnects to devices on the underlying semiconductor substrate. In an embodiment, as is also used throughout the present description, metal layers or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, a sacrificial layer 407 is provided over the ILD 405. The sacrificial layer 407 may be a material that is etch selective to the ILD 405. In some embodiments, the sacrificial layer 407 may be the same material as a subsequently deposited spacer. For example, the sacrificial layer 407 may comprise titanium and nitrogen (e.g., TiN).

In an embodiment, a grating 420 is positioned over the sacrificial layer 407. The grating 420 may comprise a plurality of parallel lines that are spaced at a regular pitch. Each of the lines may have sidewall surfaces and a top surface. The grating 420 may be any suitable material that is etch selective to the underlying sacrificial layer 407. For example, the grating 420 may comprise a hardmask material. In some embodiments, the grating 420 may comprise a single material layer, or the grating 420 may comprise a stack of more than one material layers. In a particular embodiment, the grating 420 may comprise silicon and nitrogen (e.g., SiN).

Figure 4B:
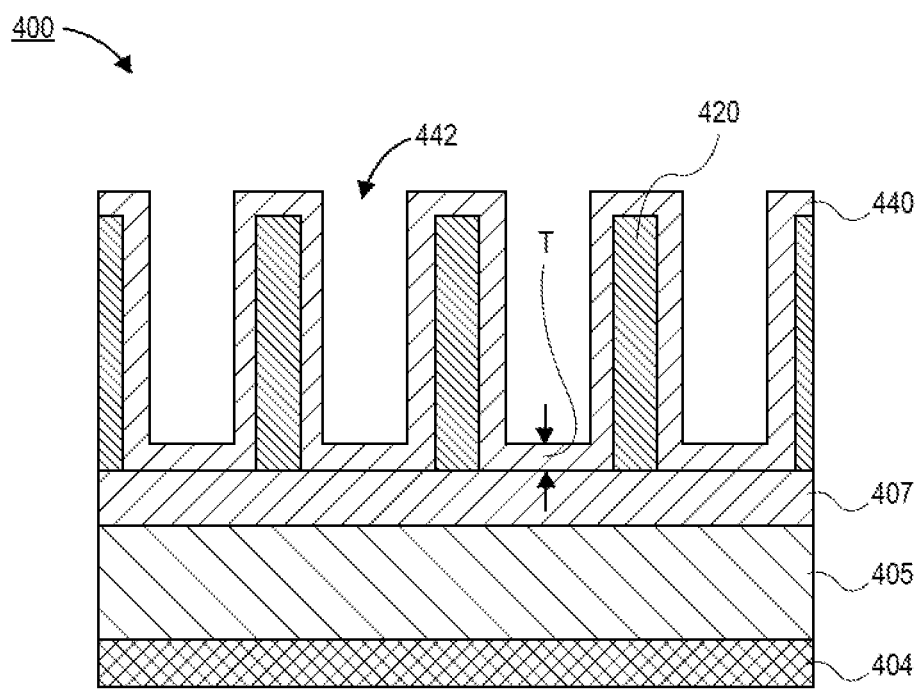
FIG. 4B is a cross-sectional illustration of the semiconductor device after a conformal spacer is disposed over the grating, in accordance with an embodiment.

Referring now to FIG. 4B, a cross-sectional illustration of the semiconductor device 400 after a spacer 440 is disposed over the grating 420 is shown, in accordance with an embodiment. The spacer 440 may be a conformal layer. That is, the spacer 440 may line the sidewalls and top surface of the grating 420. The spacer 440 may also be disposed over exposed top surfaces of the sacrificial layer 407 located between the lines of the grating 420. Any suitable conformal deposition process may be used to deposit the spacer 440. For example, the spacer 440 may be deposited by atomic layer deposition (ALD), CVD, or the like. In an embodiment, the spacer 440 may have a thickness T. In an embodiment, the thickness T may be approximately 10 nm or less, or approximately 5 nm or less. The spacer 440 may comprise a material that is etch selective to surrounding materials. For example, the spacer 440 may comprise titanium and nitrogen (e.g., TiN), which is etch selective to SiN which may be used to form the grating. In an embodiment, the spacer 440 and the sacrificial layer 407 may comprise the same material. In an embodiment, the spacer 440 reduces the width of the channel 442 between neighboring lines of the grating 420. For example, the width of the channels 442 may be defined by the vertical portions of the spacer 440.

Figure 4C:
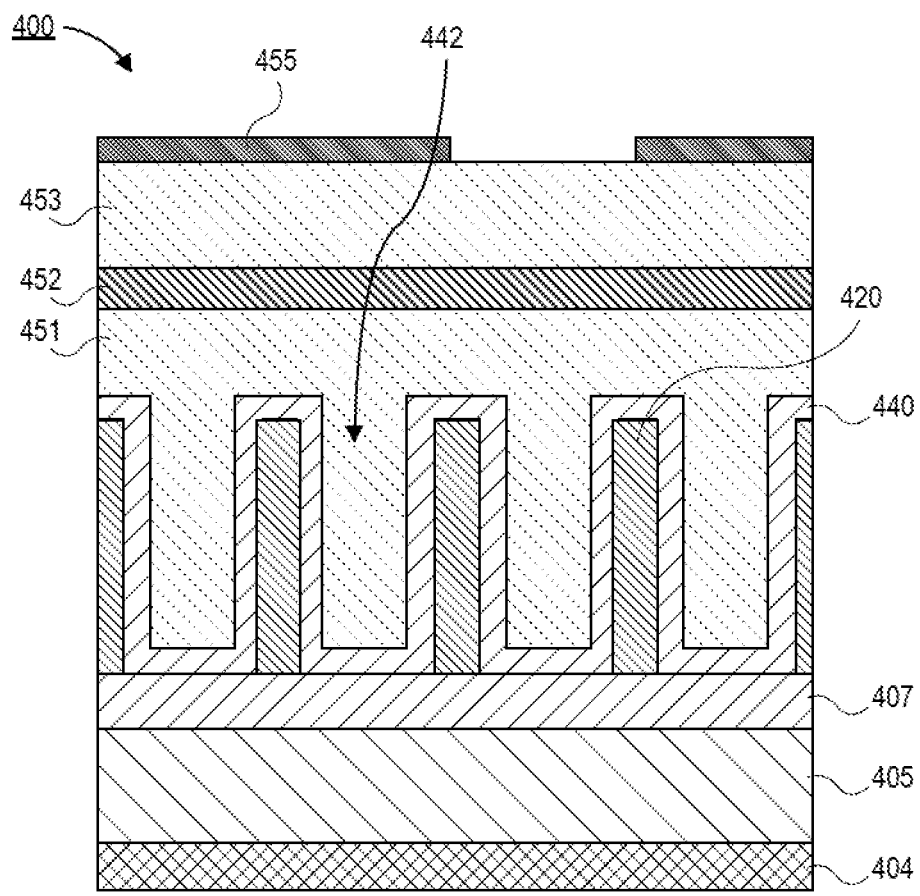
FIG. 4C is a cross-sectional illustration of the semiconductor device after a hardmask is disposed over the conformal spacer, in accordance with an embodiment.

Referring now to FIG. 4C, a cross-sectional illustration of the semiconductor device 400 after a hardmask is disposed over the spacer 440 is shown, in accordance with an embodiment. In an embodiment, the hardmask may comprise a first hardmask layer 451, an oxide layer 452, and a second hardmask layer 453. Though, it is to be appreciated that other hardmask stacks or a single hardmask material may also be used. The first hardmask layer 451 may fill the channels 442 between the lines of the grating 420. The hardmask may be patterned with any suitable lithographic process. For example, a photoresist 455 may be disposed over the second hardmask layer 453. The photoresist 455 may comprise an opening to allow for patterning of portions of the hardmask.

Figure 4D:
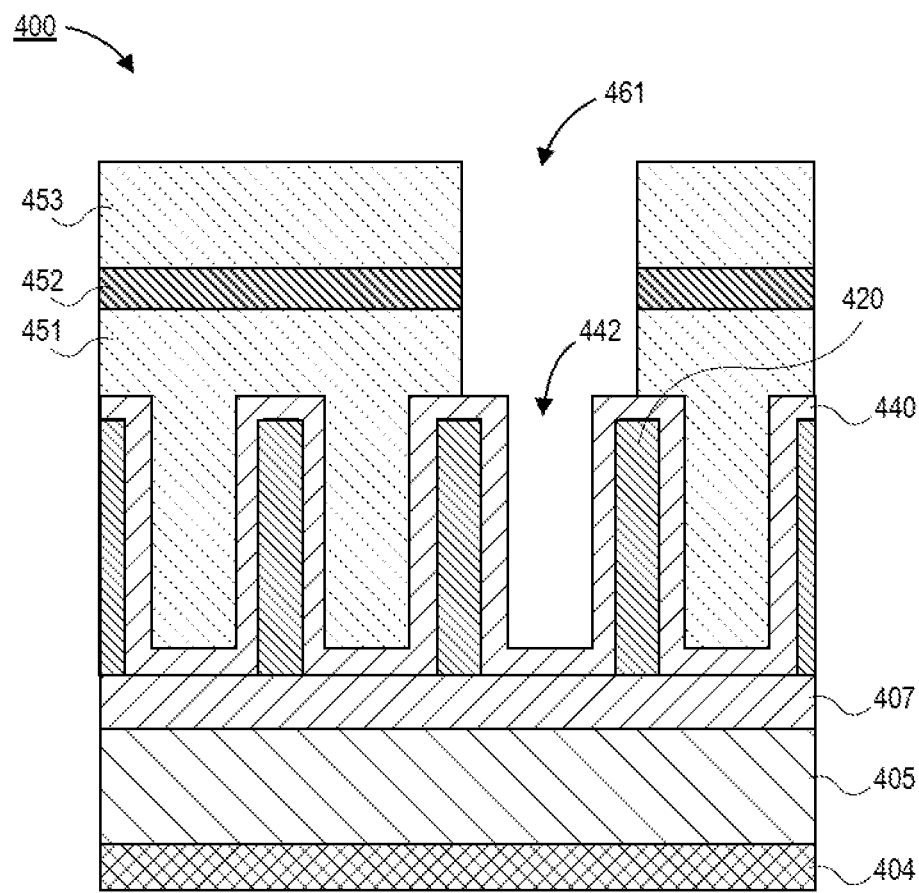
FIG. 4D is a cross-sectional illustration of the semiconductor device after an opening is patterned in the hardmask, in accordance with an embodiment.

Referring now to FIG. 4D, a cross-sectional illustration of the semiconductor device 400 after the hardmask is patterned to form an opening 461 above one of the channels 442 is shown, in accordance with an embodiment. The patterning process clears the hardmask including the portions of the first hardmask layer 451, in the exposed channel 442. That is, the channel 442 is substantially cleared during the patterning process, and sidewall surfaces and a portion of the top surface of the spacer 440 are exposed.

Figure 4E:
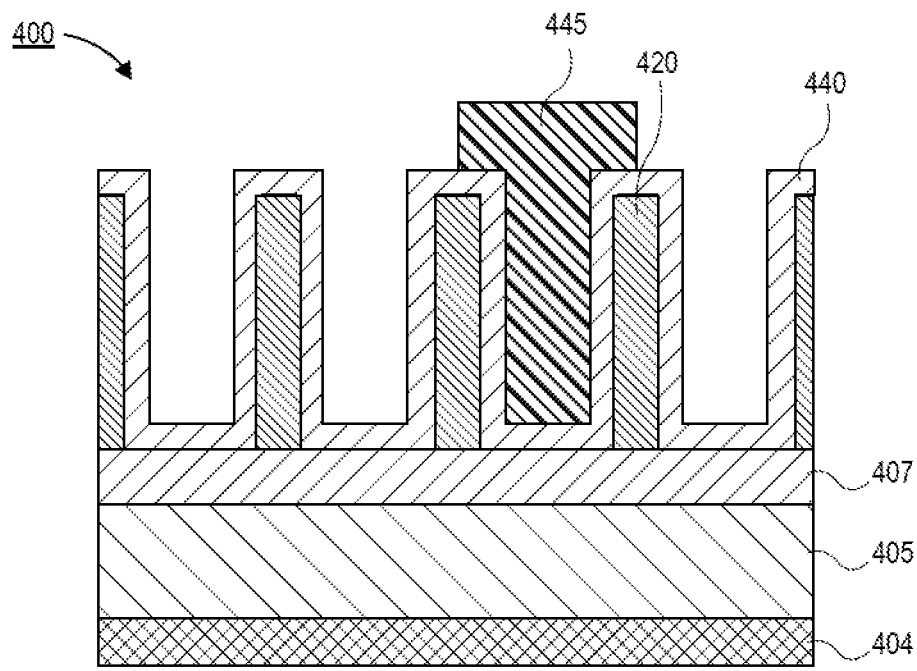
FIG. 4E is a cross-sectional illustration of the semiconductor device after a plug is provided in the opening in the hardmask, in accordance with an embodiment.

Referring now to FIG. 4E, a cross-sectional illustration of the semiconductor device 400 after a plug 445 is disposed in the channel 442 and the hardmask is removed is shown, in accordance with an embodiment. The plug 445 is disposed into the channel 442 exposed by the patterned opening in the hardmask. After formation of the plug 445, the hardmask comprising the first hardmask layer 551, the oxide 552, and the second hardmask layer 553 are selectively removed. In an embodiment, the plug 445 may be a hardmask material that is selective to the first hardmask layer 551, the oxide 552, the second hardmask layer 553, and the spacer 440.

Figure 4F:
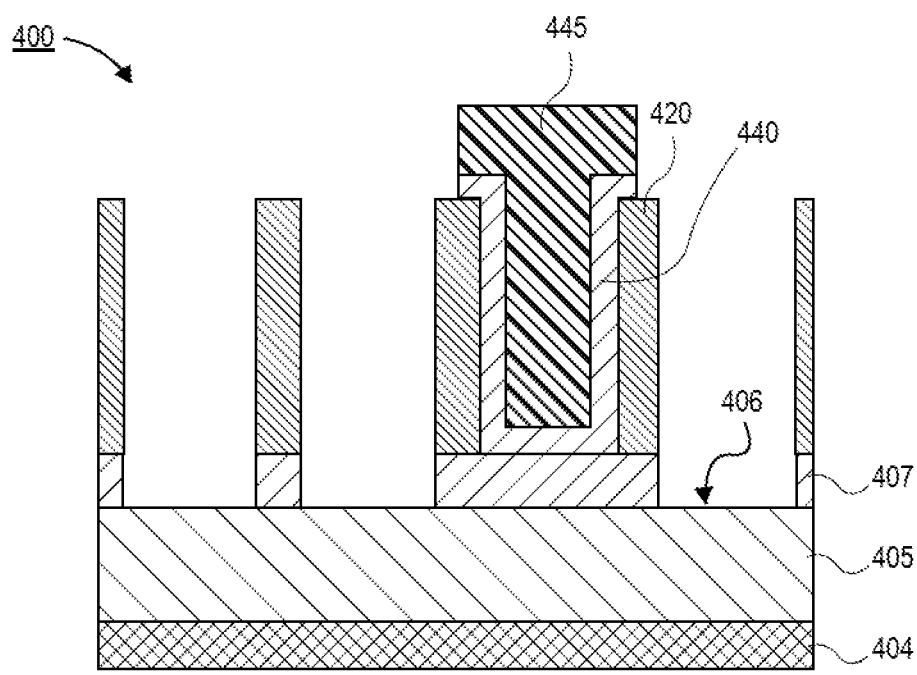
FIG. 4F is a cross-sectional illustration of the semiconductor device after the spacer is etched, in accordance with an embodiment.

Referring now to FIG. 4F, a cross-sectional illustration of the semiconductor device 400 after the spacer 440 and the sacrificial layer 407 are selectively etched is shown, in accordance with an embodiment. In an embodiment, the spacer 440 may be etched with a dry etching process. Particularly, due to the etch selectivity between the spacer 440 and the grating 420, the duration of the etch may be increased in order to accommodate minimum processing durations of HVM etching equipment. In an embodiment, the etch duration may be approximately 25 seconds or longer. During the etching process, exposed portions of the sacrificial layer 407 may also be etched. Due to the etch selectivity between the sacrificial layer 407 and the ILD 405, the surface 406 of the ILD 405 is not damaged. In an embodiment, the etching process may be biased in order to minimize or eliminate undercutting of the plug 445. As such, missing plug defects are eliminated in some embodiments.

Figure 4G:
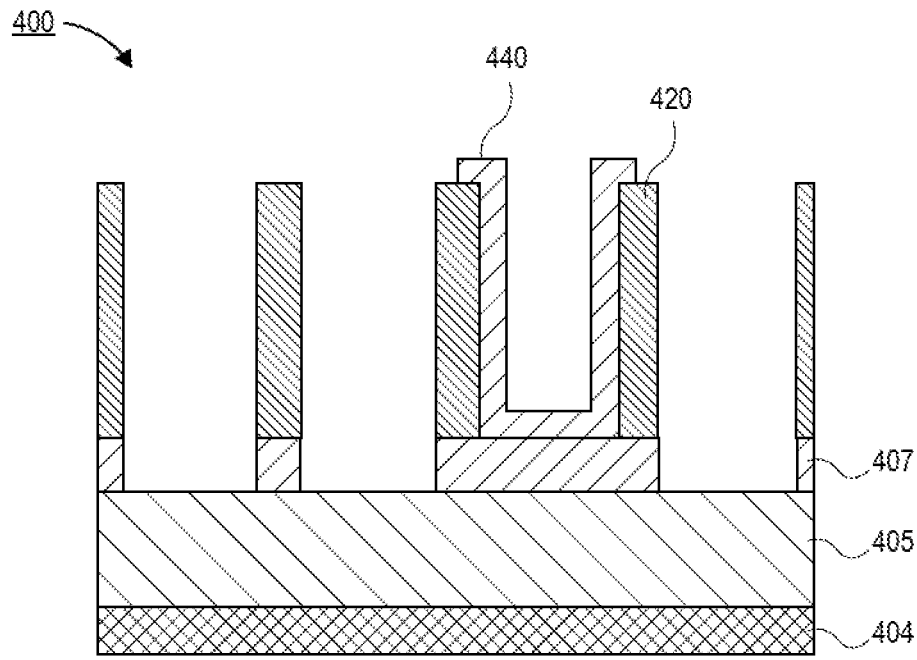
FIG. 4G is a cross-sectional illustration of the semiconductor device after the underlying interlayer dielectric (ILD) is etched, in accordance with an embodiment.

Referring now to FIG. 4G, a cross-sectional illustration of the semiconductor device 400 after the plug 445 is removed is shown, in accordance with an embodiment. In an embodiment, the plug 445 may be removed with an etching process that is selective to the spacer 440.

Figure 4H:
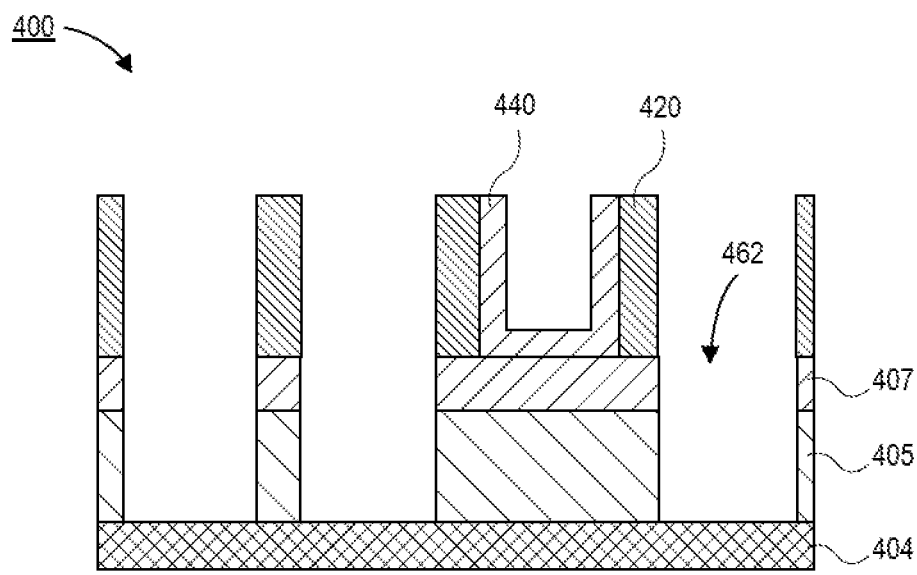
FIG. 4H is a cross-sectional illustration of the semiconductor device after the trenches are formed through the underlying interlayer dielectric (ILD), in accordance with an embodiment.

Referring now to FIG. 4H, a cross-sectional illustration of the semiconductor device 400 after trenches 462 are formed through the ILD 405 is shown, in accordance with an embodiment. In an embodiment, the trenches 462 pass through an entire thickness of the ILD 405. In an embodiment with an etchstop (not shown) between the ILD 405 and the metal layer 404, an etchstop etch may also be implemented to expose the metal layer 404. As shown in FIG. 4H, the etching process may also reduce a height of the grating 420 and remaining portions of the spacer 440. Following the process in FIG. 4H, conductive material may fill the trenches 462 using standard metal deposition processes.

Figure 5A:
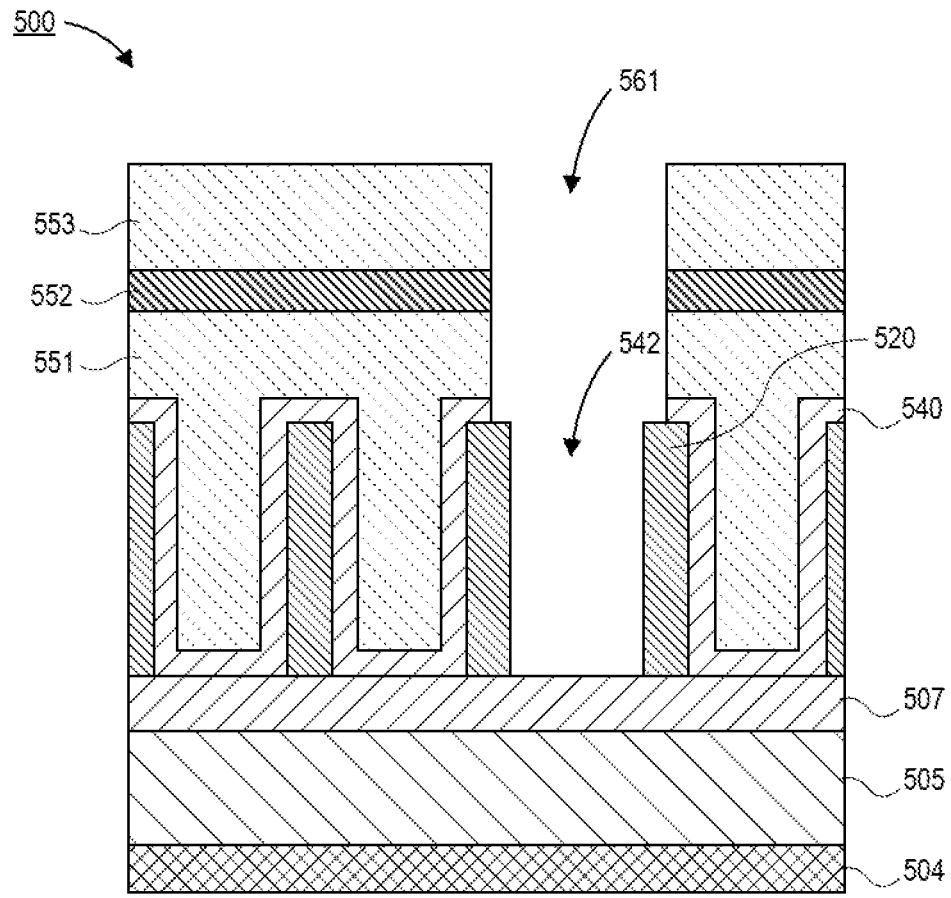
FIG. 5A is a cross-sectional illustration of a semiconductor device after an opening in a hardmask is formed to expose a portion of the spacer, in accordance with an embodiment.
Figure 5B:
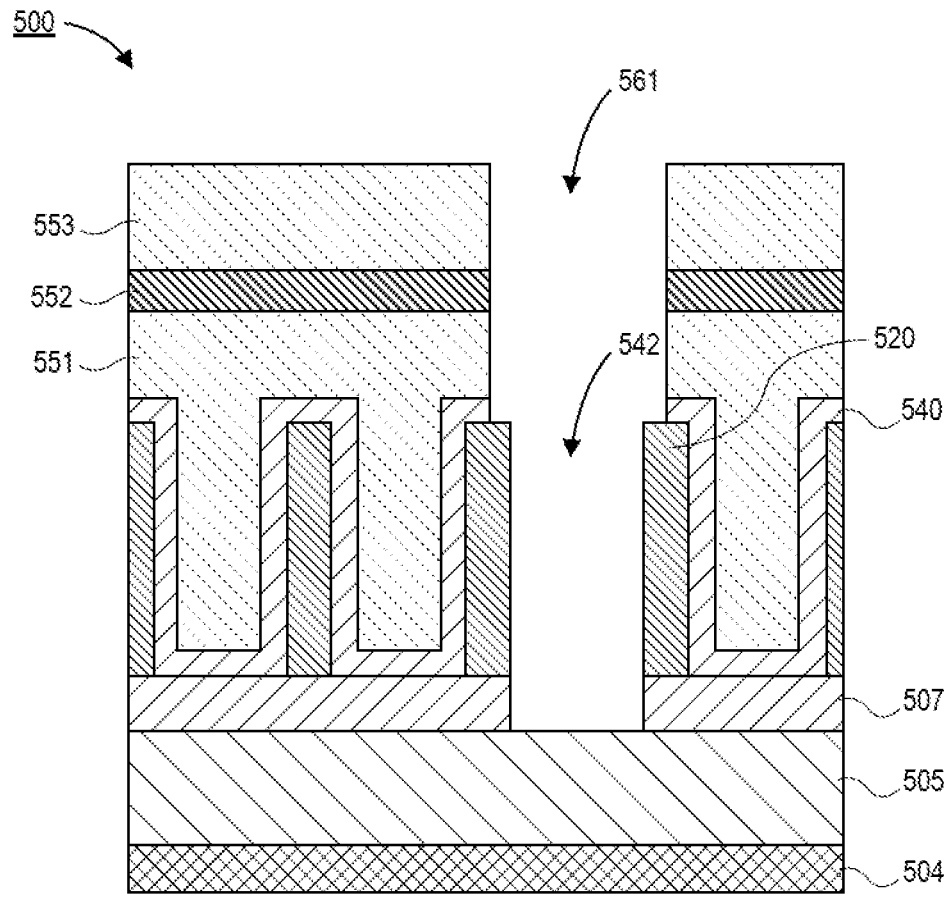
FIG. 5B is a cross-sectional illustration of the semiconductor device after the spacer is etched, in accordance with an embodiment.
Figure 5C:
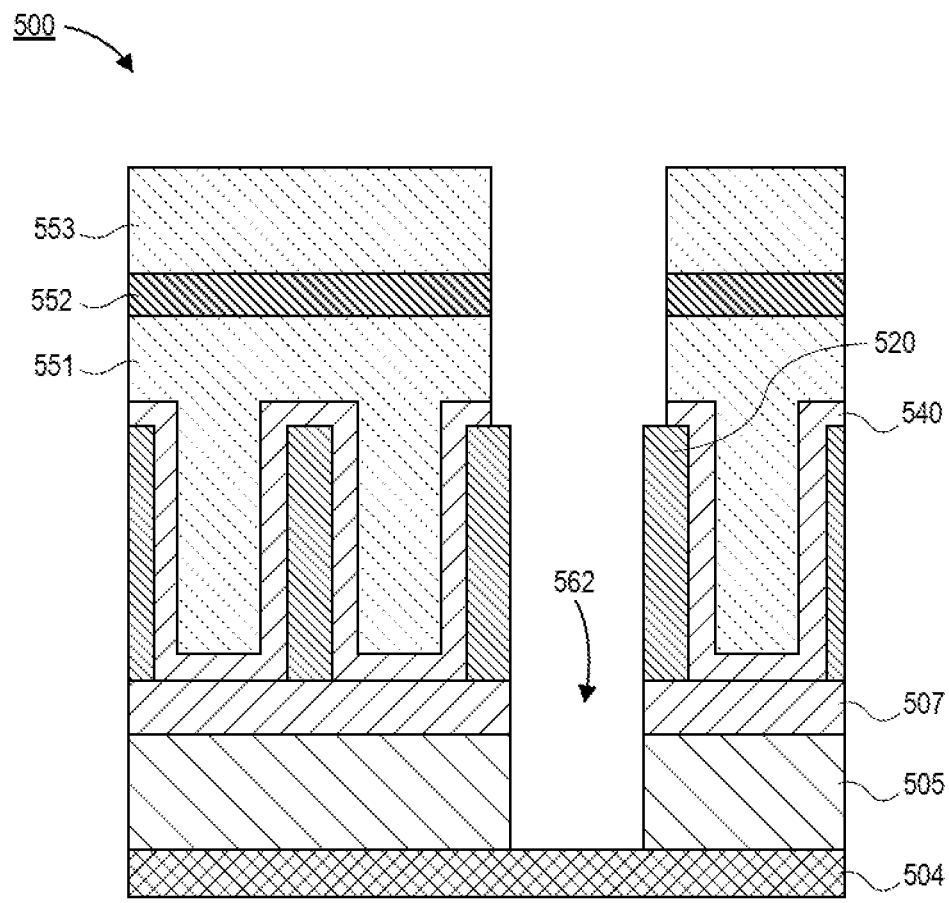
FIG. 5C is a cross-sectional illustration of the semiconductor device after a via opening is transferred into the ILD, in accordance with an embodiment.

Referring now to FIGS. 5A-5C, a series of cross-sectional illustrations depicting a process for forming a conductive via using a spacer is shown, in accordance with an embodiment. The processing of the semiconductor device 500 prior to FIG. 5A may be substantially similar to the processing in FIGS. 4A-4C, and will not be repeated here. For example, the semiconductor device 500 may comprise a metal layer 504, an ILD 505, a sacrificial layer 507, a grating 520, and a conformal spacer 540 formed with processes similar to those described above in FIGS. 4A-4C.

Referring now to FIG. 5A, a cross-sectional illustration of a semiconductor device 500 after the hardmask comprising a first hardmask layer 551, an oxide 552, and a second hardmask layer 553 is patterned to form an opening 561 is shown, in accordance with an embodiment. The opening 561 may expose a channel 542 between lines of the grating 520.

Referring now to FIG. 5B, a cross-sectional illustration of the semiconductor device 500 after the spacer 540 and the sacrificial layer 507 within the exposed channel 542 are etched is shown, in accordance with an embodiment. In an embodiment, the etching process may be selective to the grating 520. As such, the grating is left substantially undamaged. The etching process removes the spacer 540 from the sidewalls of the grating to allow for a full width via to be formed.

Referring now to FIG. 5C, a cross-sectional illustration of the semiconductor device 500 after the channel 542 is transferred into the ILD 505 to form a via opening 562 is shown, in accordance with an embodiment. In an embodiment, the via opening 562 is self-aligned with the grating 520, despite any misalignment in the patterning of the opening in the hardmask (551, 552, 553). Following the formation of the via opening 562, conductive material may be deposited into the via opening to provide a via using standard metal deposition processes.

Figure 6:
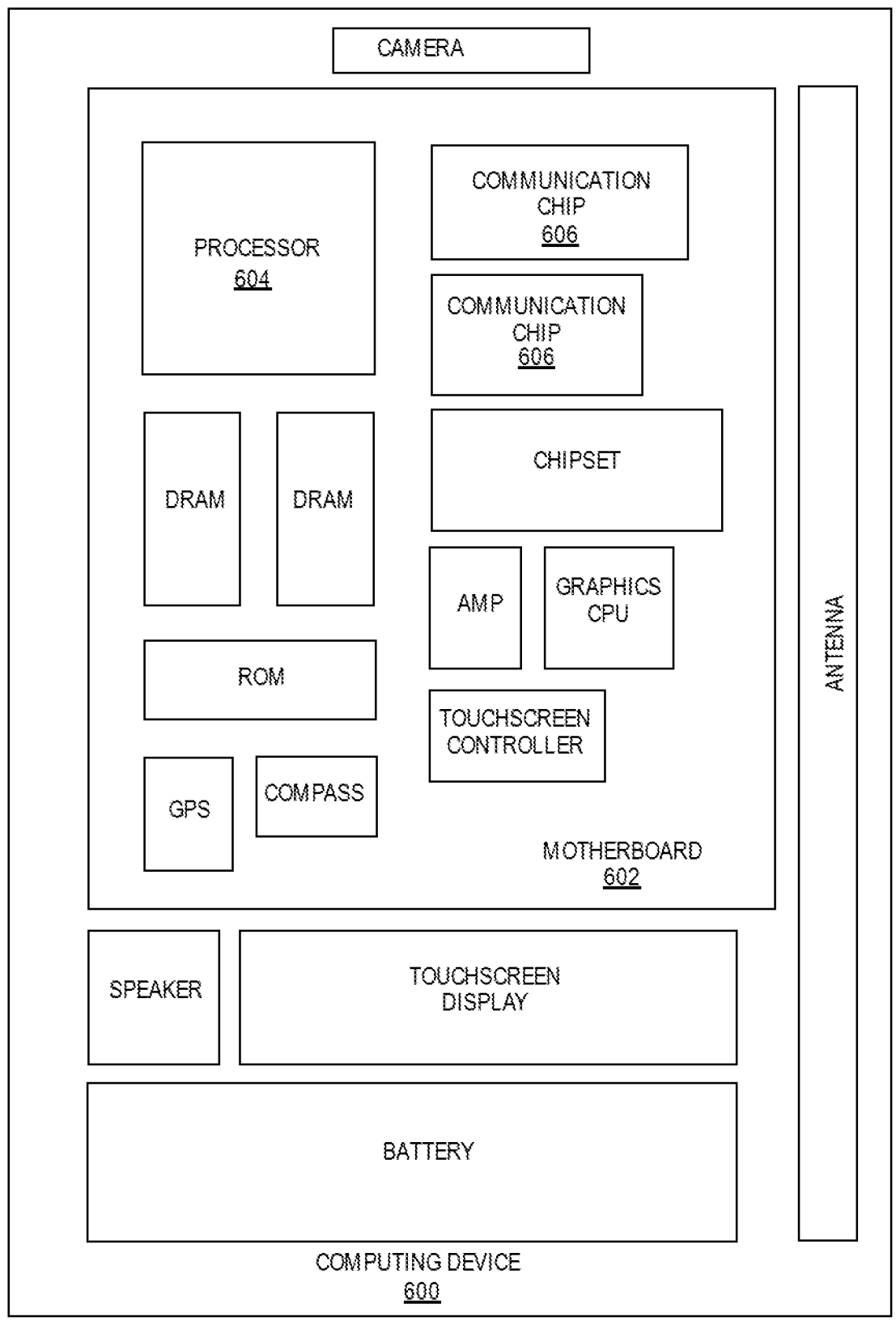
FIG. 6 illustrates a computing device in accordance with one implementation of an embodiment of the disclosure.

FIG. 6 illustrates a computing device 600 in accordance with one implementation of an embodiment of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In an embodiment, the integrated circuit die of the processor may comprise a BEOL stack that comprises one or more plugs and/or vias that are manufactured using a spacer layer, as described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In an embodiment, the integrated circuit die of the communication chip m may comprise a BEOL stack that comprises one or more plugs and/or vias that are manufactured using a spacer layer, as described herein.

In further implementations, another component housed within the computing device 600 may comprise a BEOL stack that comprises one or more plugs and/or vias that are manufactured using a spacer layer, as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
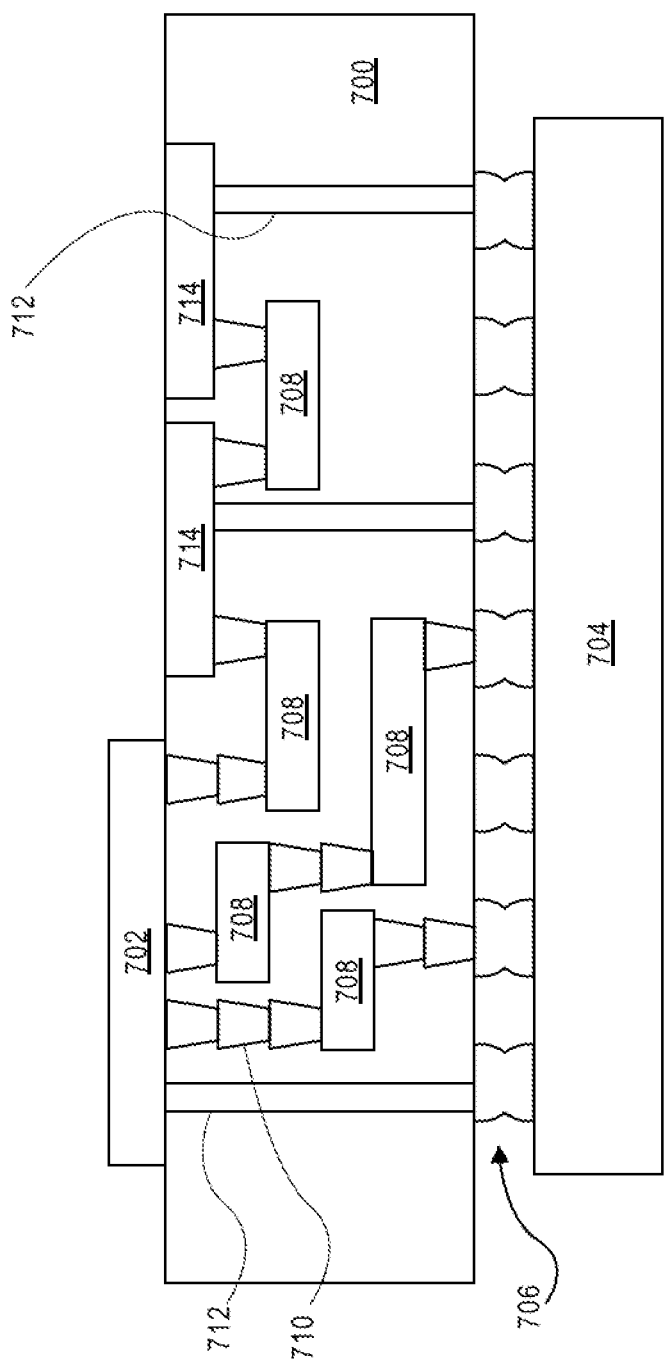
FIG. 7 is an interposer implementing one or more embodiments of the disclosure.

FIG. 7 illustrates an interposer 700 that includes one or more embodiments of the disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. In an embodiment, one of both of the first substrate 702 and the second substrate 704 may comprise a BEOL stack that comprises one or more plugs and/or vias that are manufactured using a spacer layer, in accordance with embodiments described herein. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer 700 may be formed of alternate rigid or flexible materials that may include the same materials described above for use in a semiconductor substrate, such as silicon, germanium, and other group III-V and group IV materials.

The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the disclosure, apparatuses or processes disclosed herein may be used in the fabrication of interposer 700.

Thus, embodiments of the present disclosure may comprise a BEOL stack that comprises one or more plugs, vias, and/or cuts that are manufactured using an edge placement error mitigation scheme, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a method of patterning a back end of line (BEOL) stack, comprising: forming a grating over an interlayer dielectric (ILD); forming a spacer over the grating, wherein the spacer is etch selective to the grating; disposing a hardmask over the grating and the spacer; patterning the hardmask to form an opening in the hardmask; filling the opening with a plug; removing the hardmask; etching the spacer, wherein a portion of the spacer is protected from the etch by the plug; removing the plug; and transferring the grating into the ILD with an etching process.

Example 2: the method of Example 1, wherein the grating and the spacer comprise titanium and nitrogen.

Example 3: the method of Example 1 or Example 2, wherein a thickness of the spacer is approximately 5 nm or less.

Example 4: the method of Examples 1-3, further comprising: a sacrificial layer between the ILD and the grating.

Example 5: the method of Example 4, wherein the sacrificial layer comprises the same material as the spacer.

Example 6: the method of Example 4 or Example 5, further comprising: etching through exposed portions of the sacrificial layer during the operation of etching the spacer.

Example 7: the method of Examples 1-6, wherein an etching process for etching the spacer has a duration of approximately 20 seconds or greater.

Example 8: the method of Examples 1-7, wherein an etching process for etching the spacer is a dry etching process.

Example 9: the method of Example 8, wherein the etching process is biased in order to prevent undercutting the plug.

Example 10: the method of Examples 1-9, further comprising: disposing a conductive material in the ILD after transferring the grating into the ILD.

Example 11: a method of forming a via in a back end of line (BEOL) stack, comprising: forming a grating over an interlayer dielectric (ILD); forming a spacer over the grating, wherein the spacer is etch selective to the grating; disposing a hardmask over the grating and the spacer; patterning the hardmask to form an opening in the hardmask; removing a portion of the spacer exposed by the opening in the hardmask; and transferring the opening into the ILD.

Example 12: the method of Example 11, wherein the grating and the spacer comprise titanium and nitrogen.

Example 13: the method of Example 11 or Example 12, wherein a thickness of the spacer is approximately 5 nm or less.

Example 14: the method of Examples 11-13, further comprising: a sacrificial layer between the ILD and the grating.

Example 15: the method of Example 14, wherein the sacrificial layer comprises the same material as the spacer.

Example 16: the method of Example 14 or Example 15, further comprising: etching through exposed portions of the sacrificial layer during the operation of etching the spacer.

Example 17: the method of Examples 11-16, wherein an etching process for etching the spacer has a duration of approximately 20 seconds or greater.

Example 18: the method of Examples 11-17, wherein an etching process for etching the spacer is a dry etching process.

Example 19: a method of patterning a back end of line (BEOL) stack, comprising: forming a sacrificial layer over an interlayer dielectric (ILD), wherein the sacrificial layer comprises a first material; forming a grating over the sacrificial layer, wherein the grating comprises a plurality of parallel lines with sidewalls and a top surface, wherein the plurality of parallel lines are spaced apart from each by a spacing, and wherein the grating comprises a second material that is etch selective to the first material; forming a spacer over the grating, wherein the spacer contacts the sidewalls and the top surface of the plurality of parallel lines, wherein the spacer is over exposed surfaces of the sacrificial layer, and wherein the spacer comprises the first material; disposing a hardmask over the grating and the spacer; patterning the hardmask to form an opening in the hardmask, wherein the opening extends across the spacing between a pair of adjacent parallel lines; filling the opening with a plug; removing the hardmask; etching the spacer and the sacrificial layer, wherein a portion of the spacer and a portion of the sacrificial layer are protected from the etch by the plug; removing the plug; and transferring the grating into the ILD with an etching process.

Example 20: the method of Example 19, wherein etching the spacer and the sacrificial layer comprises a dry etching process that is biased to prevent undercutting the plug.

What is claimed is:

1. A method of patterning a back end of line (BEOL) stack, comprising:

forming a grating over an interlayer dielectric (ILD);
forming a spacer over the grating, wherein the spacer is etch selective to the grating;
disposing a hardmask over the grating and the spacer;
patterning the hardmask to form an opening in the hardmask;
filling the opening with a plug;
removing the hardmask;
etching the spacer, wherein a portion of the spacer is protected from the etch by the plug;
removing the plug; and
transferring the grating into the ILD with an etching process.

2. The method of claim 1, wherein the grating and the spacer comprise titanium and nitrogen.

3. The method of claim 1, wherein a thickness of the spacer is approximately 5 nm or less.

4. The method of claim 1, further comprising:
a sacrificial layer between the ILD and the grating.

5. The method of claim 4, wherein the sacrificial layer comprises the same material as the spacer.

6. The method of claim 4, further comprising:
etching through exposed portions of the sacrificial layer during the operation of etching the spacer.

7. The method of claim 1, wherein an etching process for etching the spacer has a duration of approximately 20 seconds or greater.

8. The method of claim 1, wherein an etching process for etching the spacer is a dry etching process.

9. The method of claim 8, wherein the etching process is biased in order to prevent undercutting the plug.

10. The method of claim 1, further comprising:
disposing a conductive material in the ILD after transferring the grating into the ILD.

11. A method of forming a via in a back end of line (BEOL) stack, comprising:
forming a grating over an interlayer dielectric (ILD);
forming a spacer over the grating, wherein the spacer is etch selective to the grating;
disposing a hardmask over the grating and the spacer;
patterning the hardmask to form an opening in the hardmask;
removing a portion of the spacer exposed by the opening in the hardmask; and
transferring the opening into the ILD.

12. The method of claim 11, wherein the grating and the spacer comprise titanium and nitrogen.

13. The method of claim 11, wherein a thickness of the spacer is approximately 5 nm or less.

14. The method of claim 11, further comprising:
a sacrificial layer between the ILD and the grating.

15. The method of claim 14, wherein the sacrificial layer comprises the same material as the spacer.

16. The method of claim 14, further comprising:
etching through exposed portions of the sacrificial layer during the operation of etching the spacer.

17. The method of claim 11, wherein an etching process for etching the spacer has a duration of approximately 20 seconds or greater.

18. The method of claim 11, wherein an etching process for etching the spacer is a dry etching process.

19. A method of patterning a back end of line (BEOL) stack, comprising:
forming a sacrificial layer over an interlayer dielectric (ILD), wherein the sacrificial layer comprises a first material;
forming a grating over the sacrificial layer, wherein the grating comprises a plurality of parallel lines with sidewalls and a top surface, wherein the plurality of parallel lines are spaced apart from each by a spacing, and wherein the grating comprises a second material that is etch selective to the first material;
forming a spacer over the grating, wherein the spacer contacts the sidewalls and the top surface of the plurality of parallel lines, wherein the spacer is over exposed surfaces of the sacrificial layer, and wherein the spacer comprises the first material;
disposing a hardmask over the grating and the spacer;
patterning the hardmask to form an opening in the hardmask, wherein the opening extends across the spacing between a pair of adjacent parallel lines;
filling the opening with a plug;
removing the hardmask;
etching the spacer and the sacrificial layer, wherein a portion of the spacer and a portion of the sacrificial layer are protected from the etch by the plug;
removing the plug; and
transferring the grating into the ILD with an etching process.

20. The method of claim 19, wherein etching the spacer and the sacrificial layer comprises a dry etching process that is biased to prevent undercutting the plug.

* * * * *